(12) United States Patent
Singh et al.

(10) Patent No.: US 7,542,862 B2
(45) Date of Patent: Jun. 2, 2009

(54) CALIBRATION OF MULTI-METRIC SENSITIVE DELAY MEASUREMENT CIRCUITS

(75) Inventors: Harmander Singh, Austin, TX (US); Alan J. Drake, Round Rock, TX (US); Fadi H. Gebara, Austin, TX (US); John P. Keane, Minneapolis, MN (US); Jeremy D. Schaub, Austin, TX (US); Robert M. Senger, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 54 days.

(21) Appl. No.: 11/750,475

(22) Filed: May 18, 2007

(65) Prior Publication Data

US 2008/0288197 A1 Nov. 20, 2008

(51) Int. Cl.
*G01R 29/02* (2006.01)
*G01R 29/00* (2006.01)
*G01R 35/00* (2006.01)
*G01D 18/00* (2006.01)
*G01P 21/00* (2006.01)

(52) U.S. Cl. .............................. 702/89; 702/79; 702/80

(58) Field of Classification Search ................... 702/79, 702/80, 89, 176; 716/6
See application file for complete search history.

(56) References Cited

U.S. PATENT DOCUMENTS

| 5,638,418 | A | 6/1997 | Douglass et al. |  |
|---|---|---|---|---|
| 6,631,503 | B2 * | 10/2003 | Hsu et al. | 716/4 |
| 6,769,100 | B2 * | 7/2004 | Acar et al. | 716/4 |
| 2006/0273831 | A1 | 12/2006 | Macksimovic et al. |  |
| 2007/0132493 | A1 * | 6/2007 | Fujisawa et al. | 327/158 |
| 2007/0257714 | A1 | 11/2007 | Cheung |  |
| 2008/0126010 | A1 * | 5/2008 | Cranford et al. | 702/180 |
| 2008/0288196 | A1 * | 11/2008 | Singh et al. | 702/79 |

OTHER PUBLICATIONS

Nonvolatile Memory, Britannica Online Encyclopedia, retrieved Sep. 5, 2008.*
Chen, et al., "A Time-to-Digital-Converter-Based CMOS Smart Temperature Sensor", IEEE, JSSC, vol. 40, No. 8, Aug. 2005.
Dudek, et al., "A High Resolution CMOS Time-to-Digital Converter Utilizing a Vernier-Based Delay Line", IEEE Trans. on Solid-State Circuits, vol. 35, No. 2, Feb. 2000.
Restle, et al., "Timing Uncertainty Measurements on the Power5 Microprocessor", 2004 IEEE ISSC Conference, Jun. 2004.
Office Action in U.S. Appl. No. 11/750,385 dated Sep. 10, 2008.

* cited by examiner

*Primary Examiner*—Michael P Nghiem
(74) *Attorney, Agent, or Firm*—Mitch Harris, Atty at Law, LLC; Andrew M. Harris; Casimer K. Salys

(57) ABSTRACT

A method and system for calibration of multi-metric sensitive delay measurement circuits provides for reduction of process-dependent variation in delays and their sensitivities to circuit metrics. A process corner for the delay circuit(s) is determined from at least one delay measurement for which the variation of delay due to process variation is previously characterized. The delay measurement(s) is made at a known temperature(s), power supply voltage(s) and known values of any other environmental metric which the delay circuit is designed to measure. Coefficients for delay versus circuit metrics are then determined from the established process corner, so that computation of circuit metric values from the delay measurements have improved accuracy and reduced variation due to the circuit-to-circuit and/or die-to-die process variation of the delay circuits.

10 Claims, 11 Drawing Sheets

CALIBRATION OF MULTI-METRIC SENSITIVE DELAY MEASUREMENT CIRCUITS

CROSS-REFERENCE TO RELATED APPLICATION

The present application is related to co-pending U.S. patent application Ser. No. 11/750,385, filed May 18, 2007 and entitled "CALIBRATION OF MULTI-METRIC SENSITIVE DELAY MEASUREMENT CIRCUITS". The above-referenced U.S. Patent Application has at least one common inventor, is assigned to the same Assignee, and is incorporated herein by reference.

BACKGROUND OF THE INVENTION

1. Field of the Invention

The present invention is related to delay-based circuits for measuring metrics such as circuit environment variables, and more particularly to circuits and methods that correct metric measurements made by delay-based circuits.

2. Description of Related Art

Delay-based measurement circuits are finding application in integrated circuits such as processor cores, in which it is useful to evaluate and/or monitor variation in circuit environment metrics such as temperature and supply voltage. Not only do such metrics vary for an integrated circuit external environment, but variations across a die can lead to substantial changes in circuit performance. Therefore, it is useful to make measurements both to evaluate a design and to ensure proper operation of an integrated circuit in the end application. Further, such delay-based measurement circuits are useful as sensor devices, where the application is to monitor a condition such as voltage, current or temperature in an electronic system or temperature in general.

Delay-based measurement circuits are desirable for circuit integration, as they do not require any special process techniques, are compact and are easily designed. Typically, an inverter chain is used to generate a one-shot delay or is connected in an inverting ring configuration to form a ring oscillator. The delay of the one-shot delay or the frequency of the ring oscillator is then measured to yield a measure of a metric to which the delay circuit is sensitive, such as supply voltage or temperature.

However, when multiple circuit parameters of the delay circuit are varying, variation in parameters other than the circuit metric being measured causes error in the measurement. For example, a delay circuit may be used to measure temperature, but if the supply voltage provided to the delay circuit varies substantially, the supply voltage variation introduces error in the temperature measurement. Further, the sensitivities and offset of the delay circuits vary widely by process, to a degree that approaches or even exceeds the variation of delay with the circuit metric being measured.

Therefore, it would be desirable to provide a delay-based metric measurement circuit having improved accuracy and process variation independence. It would further be desirable to provide a delay-based metric measurement circuit that can measure multiple circuit metrics and provide for more accurate measurements of each metric, with low circuit-to-circuit and/or die-to-die variation.

SUMMARY OF THE INVENTION

The above objectives of providing a delay-based measurement circuit having improved accuracy and independence from process variation is provided in a method and system.

The method provides for calibration of a circuit metric measuring delay circuit by determining a process corner of the delay circuit from either an absolute delay measurement under fixed environmental conditions or a difference in delay measurements when a circuit metric is varied by a predetermined metric difference. Once the delay measurement(s) have been made under the fixed conditions, the process corner is established from predetermined relationships between the delay(s) and process variation from circuit-to-circuit and/or die-to-die. Coefficients relating the delay(s) to the circuit metric(s) for which subsequent measurements are made are determined in conformity with the circuit's process corner, i.e., the position of the actual circuit within the distribution of expected circuit process variation.

The coefficients are either loaded into non-volatile storage in the die, or are provided to a software algorithm used to calculate circuit metric values from delay measurement values provided from the die. The delay circuit may be a multiple-delay circuit that determines a first and second delay time indication from a first and second delay circuit. The first and second delay time circuit may have differing delay time sensitivities to a metric under measurement. The delay circuits may be ring oscillators and the delay time indication a measured ring oscillator period, or the delay circuits may be delay lines, and the delay time indication an actual one-shot delay period. The value of a circuit metric, such as supply voltage or temperature, that is determined from the delay time of the first circuit, may be corrected for variation of another circuit metric by a delay measurement provided from another delay circuit that has a generally greater sensitivity to the other circuit metric. The coefficients used for correction and determination of the circuit value also compensate for process variation, as they are determined from the calibration described above.

The calculation of the circuit metric(s) from the delay values using coefficients corrected for process variation may be performed by a correction circuit integrated with the delay circuits, which may be a processing element, a set of look-up tables addressed by the delay indications, or logic that performs the corrections by determining the circuit metric result value(s) from delay time indications received as logical inputs. Alternatively, the delay circuit delay time indications and coefficients as described above, may be provided to an external processing device via registers such as scan latches or interface ports, so that external computational algorithms may be executed to perform the corrections or solve simultaneous equations that compute the value of the circuit metrics from the delay time indications with correction for process variation.

The foregoing and other objectives, features, and advantages of the invention will be apparent from the following, more particular, description of the preferred embodiment of the invention, as illustrated in the accompanying drawings.

DETAILED DESCRIPTION OF PREFERRED EMBODIMENT

The present invention relates to circuits and methods for measuring circuit metrics such as supply voltage and temperature. The circuits are simple and compact enough for distribution across a die, so that variation of temperature and supply voltage, etc. can be measured. Alternatively, the circuits may be employed as a single sensor for monitoring average die temperature and supply voltage, or integrated as a stand-along sensing device. The present invention provides improved accuracy over prior art delay-based circuit metric measurement circuits by using coefficients relating measured delay(s) to circuit metric value(s) with correction for process variation by a previous measurement under controlled values of the circuit metric(s).

Figure 1A:
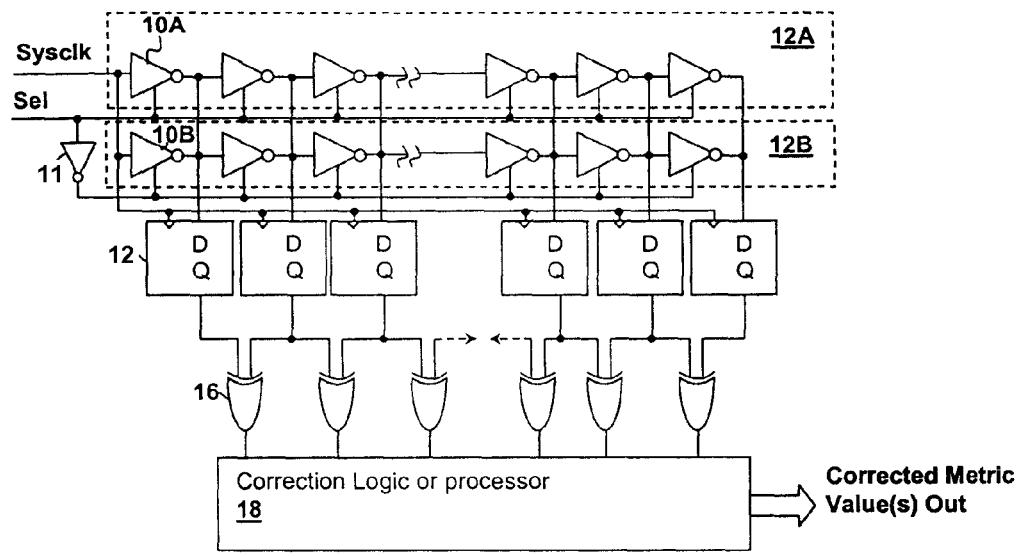
FIG. 1A is a schematic diagram depicting a delay measurement circuit according to an embodiment of the present invention.

Referring now to FIG. 1A, a measurement circuit in accordance with an embodiment of the present invention is shown. In the depicted embodiment, a first delay line 12A that is sensitized to temperature, but is insensitive to variation in supply voltage, is enabled when selection signal Sel is set to a logic "1" state. A cascade of tri-state inverter stages 10A, that are designed to have a propagation delay that varies substantially with temperature, but not with supply voltage, are connected to a set of D-latches 14 that are clocked with a clocks signal Sysclk. When clock signal Sysclk transitions and propagates through delay circuit 12A, at a next transition of clock signal Sysclk the state of the outputs of each of inverter stages 10A is captured in D-latches 14. The initial stages of delay line 12A will have logical states determined directly by the state of clock signal Sysclk and the number of inversions corresponding to the position of the inverter stage, i.e., delay line 12A will contain an alternating pattern of logical "1"s and "0"s but at some stage along delay line 12A, the propagation will exceed the half-period of clock signal Sysclk and the propagating alternating pattern will change polarity at that stage. The outputs of adjacent D-latches 14 are compared with exclusive-OR gates 16, so that a logical one will be produced at the output of each of exclusive-OR gates 16, except for adjacent D-latches 14 at which a phase change is present. A correction logic or processor block 18 detects the phase-change position and uses the phase-change position as a measured indication of the delay of delay line 12A.

After the delay of delay line 12A is measured, the state of selection signal Sel is set to a logical "0" state and the delay of delay circuit 12B is similarly measured. Delay line 12B is formed from a cascade of inverter stages 10B that are designed to have a propagation delay that varies substantially with supply voltage, but not with temperature. Correction logic or processor block 18 detects the phase-change position for the second measurement and uses the phase-change position as a measured indication of the delay of delay line 12B. Correction logic or processor block 18 further computes a resulting temperature and/or supply voltage value from the measured delays. The sensitivity of at least one of the delays of delay line 12A and/or 12B to the circuit metric (voltage or temperature in the example) is pre-characterized for both the circuit metric to which the delay(s) is most sensitive and the circuit metric to which the delay(s) has lesser sensitivity. The delay measured for the other delay line is used to correct (or further improve the model of) the circuit metric as indicated by the delay line that is most sensitive to the circuit metric.

For example, if D1 is the delay of first delay line 12A circuit, D2 is the delay of the second delay line and have values modeled as:

$$D1 = 0.1 \text{ ps}/°C. - 0.1 \text{ ps}/V + D1(\text{nominal})$$

$$D2 = 0.01 \text{ ps}/°C. - 10 \text{ ps}/V + D2(\text{nominal})$$

if the supply voltage varies by 200 mV and the temperature by 10° C., then D1 will change by 1 ps due to the temperature and −0.02 ps due to the voltage change. D2 will change by −0.1 ps due to the temperature change, but −2 ps due to the voltage change. A first-order correction can be made to the measured temperature value indicated by D1=0.98 by assuming that all of the change in D2 is due to the supply voltage change, which indicates that the supply voltage has changed by −1.9 ps/10 (ps/V) or 190 mV. A supply-voltage corrected value for D1' is computed as 0.98+190 mV*0.1 ps/V=0.998, which has an error of 0.2% versus an error of 2% for the uncorrected temperature indicated by D1 alone. The supply voltage variation as indicated by delay D2 can be similarly corrected. While the above example illustrates two delay circuits having very high sensitivities to one circuit metric and low sensitivities to the other circuit metric by comparison, such differentiation is not a requirement of the present invention. It is only necessary that two delay circuits have a differing sensitivity to one circuit metric, and that the sensitivities of one of the delay circuit to both circuit metrics are characterized well enough to be useful in adjusting the measured value for a first second metric from a value of the second circuit metric as indicated by the second delay circuit.

In some embodiments of the present invention, in particular those in which a processing element is available to perform mathematical computations, or in embodiments in which correction logic or processor block 18 is implemented by a pre-computed look-up table, the delay indications from delay lines 12A and 12B may be combined to effectively solve a set of simultaneous equations that yield one or more corrected circuit metric results. In the above example, supposing that at a minimum D1 is known as D1=0.1 ps/° C.−0.1 ps/V+D1 (nominal) but D2 is only known as D2=−10 ps/V+D2(nominal), solving the above expressions together still yields the single corrected temperature result exemplified above. However, if D2 is known as D2=0.01 ps/° C.−10 ps/V+D2(nominal), then an even more accurate result can be obtained by simultaneously solving the expressions for D1 and D2, or iteratively determining the results.

Figure 1B:
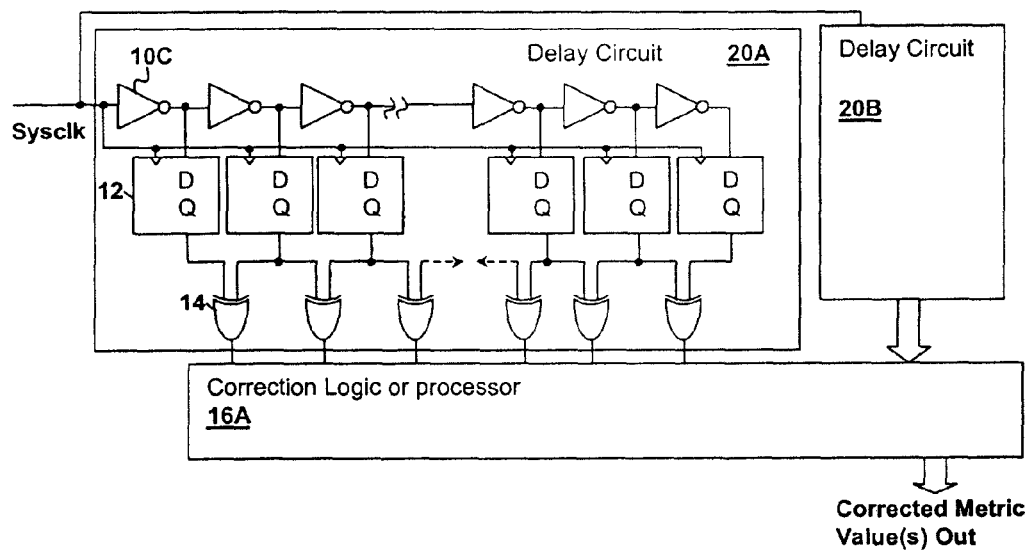
FIG. 1B is a schematic diagram depicting a delay measurement circuit according to another embodiment of the present invention.

Referring now to FIG. 1B, a measurement circuit in accordance with another embodiment of the present invention is shown. In the depicted embodiment, a first delay circuit 20A that is sensitized to temperature, but is insensitive to variation in supply voltage includes D-latches 12 and logical exclusive-OR gates 14 as described above for the circuit of FIG. 1A. However, inverter stages 10C that form the delay line portion of delay circuit 20A are continuously enabled, and so tri-state inverter stages are not required for implementation. Another delay circuit 20B has an identical circuit structure, except for the design of the delay line inverter stages, which are sensitized to supply voltage. The outputs of delay circuit 20A and delay circuit 20B are provided to correction logic or processor 16A. The circuit depicted in FIG. 1B provides for simultaneous measurement of two delay values, in contrast to the operation circuit of FIG. 1A, in which the delay measurements are sequential. Other than the simultaneous measurement of delay values, the operation and computation applied to the resulting delays of the circuit of FIG. 1B are identical to the above-described operation of the circuit of FIG. 1A. Further, the delay measurements are not necessarily taken at the same rates for each of delay circuits 20A and 20B. Since temperature typically varies more slowly than supply voltage, the more temperature-sensitive delay circuit 20A may be measured after a number of measurements of the delay of delay circuit 20B have been made. The edge-capture circuit of FIG. 1B especially lends itself to cycle-by-cycle supply voltage measurements and therefore in some applications it is desirable to operate the circuit of FIG. 1B with delay circuit 20B active for every cycle except for a periodic measurement of delay circuit 20A to update for a slowly-changing temperature.

Figure 2A:
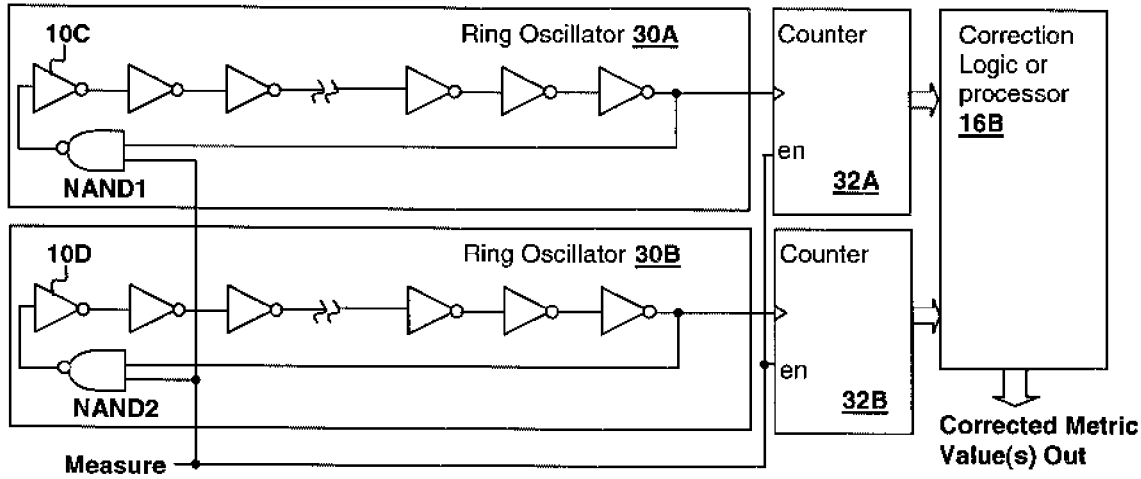
FIG. 2A is a schematic diagram depicting a ring oscillator circuit according to an embodiment of the present invention.

Referring now to FIG. 2A, a ring oscillator measurement circuit in accordance with an embodiment of the present invention is shown. Rather than detecting transitions as in the circuits of FIGS. 1A-1B, in the circuit of FIG. 2A, ring oscillator 30A provides a frequency of oscillation that is sensitized to temperature, while ring oscillator 30B provides a frequency of oscillation that is sensitized to supply voltage. Ring oscillator has a delay formed from a ring including inverter stages 10C (non tri-state as in the circuit of FIG. 1B) and a logical-NAND gate NAND1, which is provided to enable/disable oscillation in response to a Measure signal, which has a known period, e.g., a signal derived from the Sysclk signal as described above with reference to FIG. 1A. A counter 32A counts oscillations of ring oscillator 32A while the Measure signal is asserted, and thus provides an indication of the delay of the delay line formed from inverter stages 10C and logical-NAND gate NAND1 to correction logic or processor 16B. Correction logic or processor 16B operates as described above with reference to FIG. 1A, except that the input values received from counter 32A and another counter 32B, are values corresponding directly to the time delay of the delay line in ring oscillator 30A and another delay line within delay circuit 30B formed from inverter stages 10D and logical-NAND gate NAND2. Since the Measure signal has a known period, the delay values indicated by the outputs of counters 32A and 32B provide an accurate measure of the frequencies of oscillation of ring oscillators 30A and 30B, respectively.

Figure 2B:
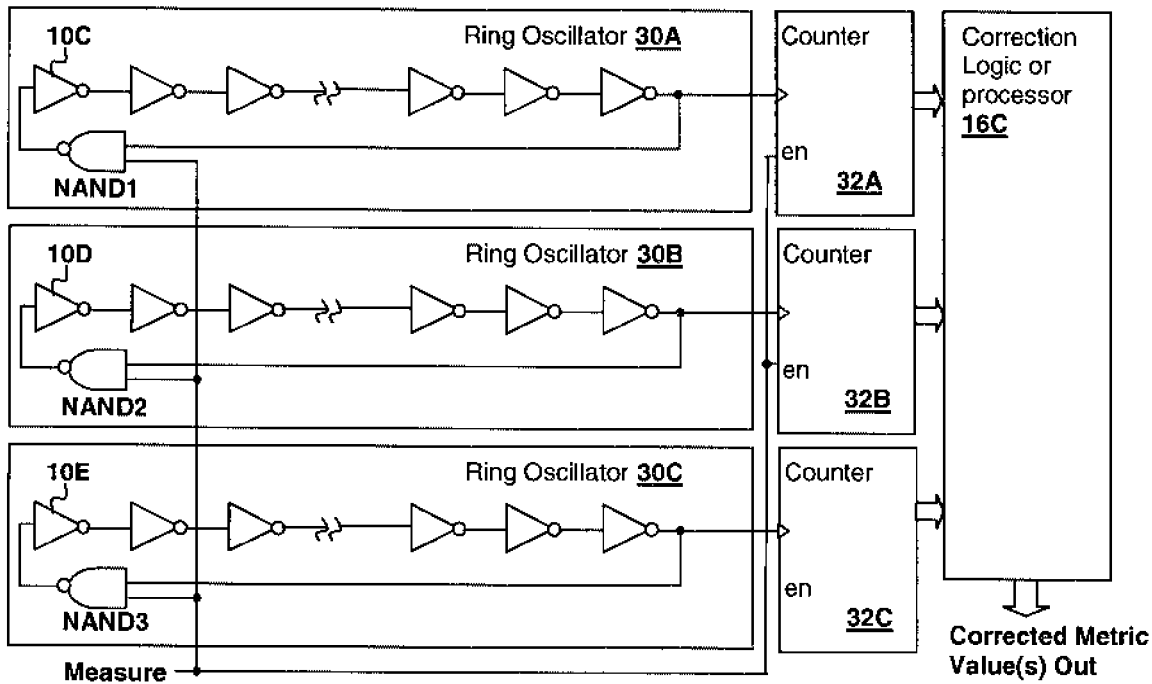
FIG. 2B is a schematic diagram depicting a ring oscillator circuit according to another embodiment of the present invention.

Referring now to FIG. 2B, a ring oscillator measurement circuit in accordance with another embodiment of the invention is shown. In the depicted embodiment, a third ring oscillator 30C is added to the circuit of FIG. 2A, and includes inverter stages 10E and logical-NAND gate NAND3. Inverter stages 10E differ in circuit metric sensitivities from inverter stages 10C and 10D, and may be ordinary inverter stage designs, i.e., the circuit design of inverter stages 10E may be such that they are not sensitized to a particular circuit metric such as supply voltage or temperature and are not particularly de-sensitized. Ring oscillator 30C is used to provide a reference point that can permit tracking of another metric, such as the period of a Measure signal if the period is not accurately known. For example, the Measure signal in the circuit of FIG. 2B could be generated from a circuit-delay based self-oscillating ring or ramp oscillator. Counter 32C performs a delay measurement based on the frequency of ring oscillator 30C and provides the delay value to correction logic or processor 16C, which uses the three delay values to determine at least one circuit metric value(s) independent of the period of the Measure signal and other metric values.

Figure 3:
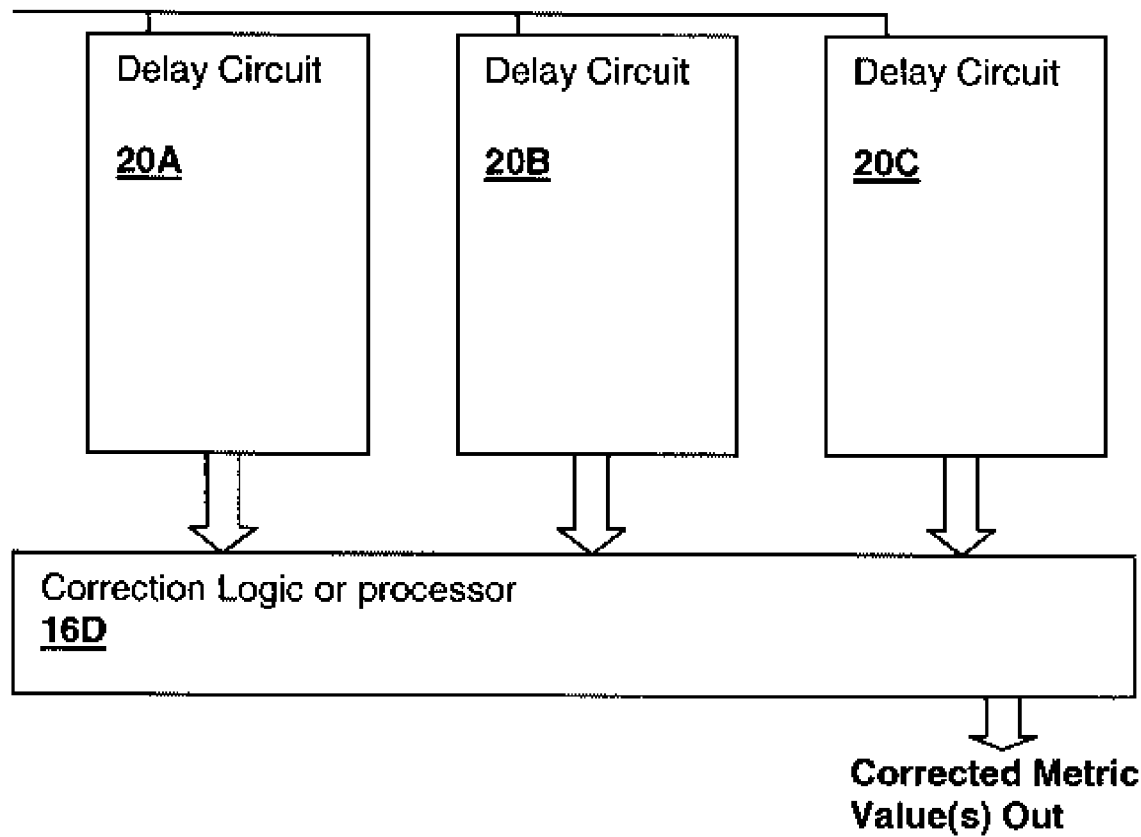
FIG. 3 is a schematic diagram depicting a delay measurement circuit according to yet another embodiment of the present invention.

Referring now to FIG. 3, a delay measurement circuit in accordance with yet another embodiment of the invention is depicted. In the depicted embodiment, delay circuits 20A and 20B are present as in the circuit of FIG. 1B, but an additional delay circuit 20C is included to provide a third delay indication to act as a reference point. As described above with reference to FIG. 2B, the delay line in delay circuit 20C does not have to be sensitized/desensitized to any particular circuit metric, and thus permits the period of the Sysclk or Osc signal to vary with process, while still providing accurate results. Correction logic or processor 16D, which uses the three delay indications to determine at least one circuit metric value independent of the period of the Sysclk or Osc signal and other circuit metrics.

Figure 4A:
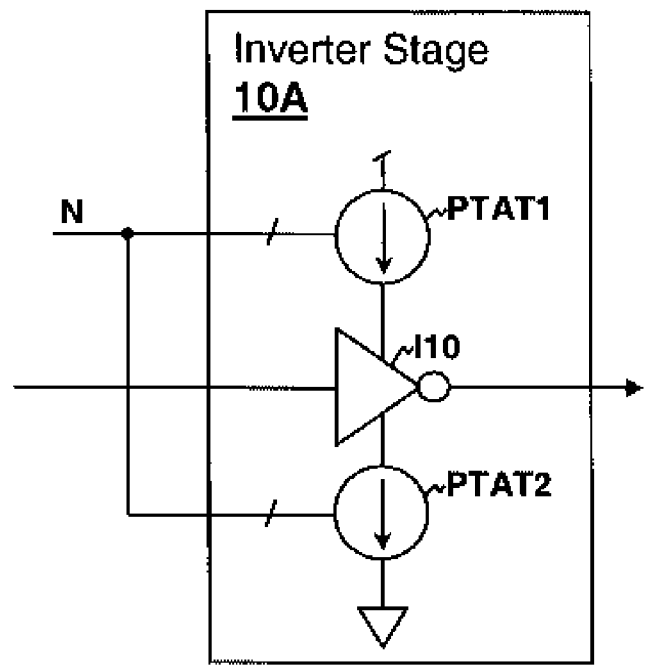
FIGS. 4A and 4B are schematic diagrams of inverter stages as may be used to provide differing circuit metric sensitivities in the circuits of FIGS. 1A-1B, 2A-2B and FIG. 3.
Figure 4B:
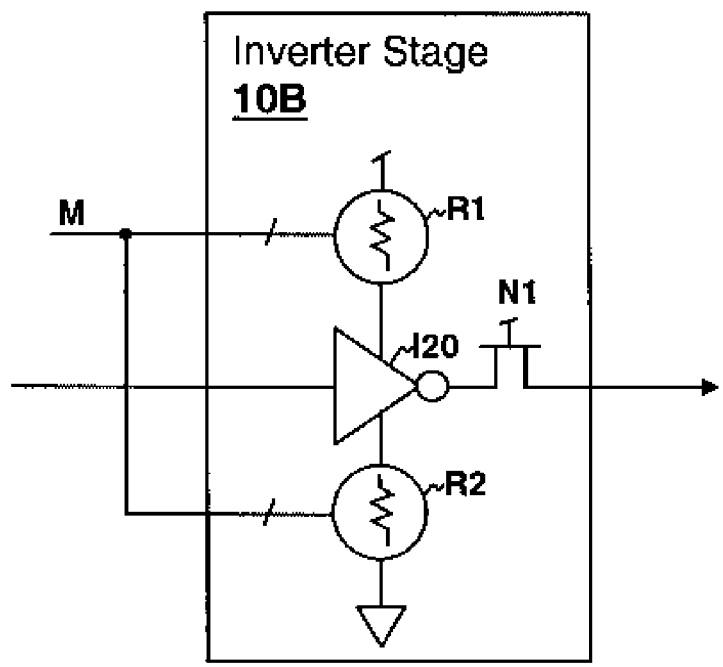

Referring now to FIGS. 4A and 4B, inverter stage circuit 10A and 10B, as may be employed in the above-described circuits of FIGS. 1A-1B, 2A-2B and FIG. 3 are shown. Inverter stage 10A of FIG. 4A is sensitized to temperature and desensitized to supply voltage. A proportional-to-absolute temperature (PTAT) current source PTAT1 couples the positive power supply rail to inverter I10 and another PTAT current source PTAT2 couples the negative power supply rail to inverter I10. Therefore, as the power supply voltage changes, the current-fed inverter will see no variation in the current supplied to charge the capacitance connected to the output of inverter I10, and thus the delay time of inverter I10 is substantially constant with power supply voltage. However, since the current supplied by PTAT1 and PTAT2 is set by the ambient temperature, the delay time of inverter I10 is very sensitive to temperature. Further, current sources PTAT1 and PTAT2 can be calibrated by a trimming value N either in a test setup prior to leaving the manufacturer, or using an integrated calibration circuit. By adjusting the value of current sources PTAT1 and PTAT2, a very high degree of accuracy can be obtained for the absolute temperature value measured by delay circuits of the present invention.

Inverter stage 10B of FIG. 4B is sensitized to power supply voltage variations. Since inverters in CMOS processes are not typically very temperature sensitive, inverter I20 is inherently desensitized to temperature. Resistor R1 couples the positive power supply rail to inverter I20 and resistor R2 couples the negative power supply rail to inverter I20. Resistors R1 and R2 are provided to cancel process variations in inverter I20 and are set by trim value M, which can be factory calibrated or adjusted by an integrated calibration circuit. Transistor N1 provides the bulk of the supply voltage sensitivity increase, as the current provided from the output of inverter stage 10B will vary with the power supply voltage due to the channel resistance of transistor N1. While inverter stage 10A of FIG. 4A and inverter stage 10B of FIG. 4B provide examples of inverter stages sensitized to particular circuit metrics, and are of particular design, it is understood that other inverters having greater or less sensitivity to the particular circuit metrics can also be used and that other circuit metrics may be measured. For example, a current may be measured by mirroring the current to control the current supplied to a set of inverters forming a delay line. Further, direct measurement of particular process parameters may be performed by designing inverters having sensitivities tailored to particular process parameters.

Figure 5:
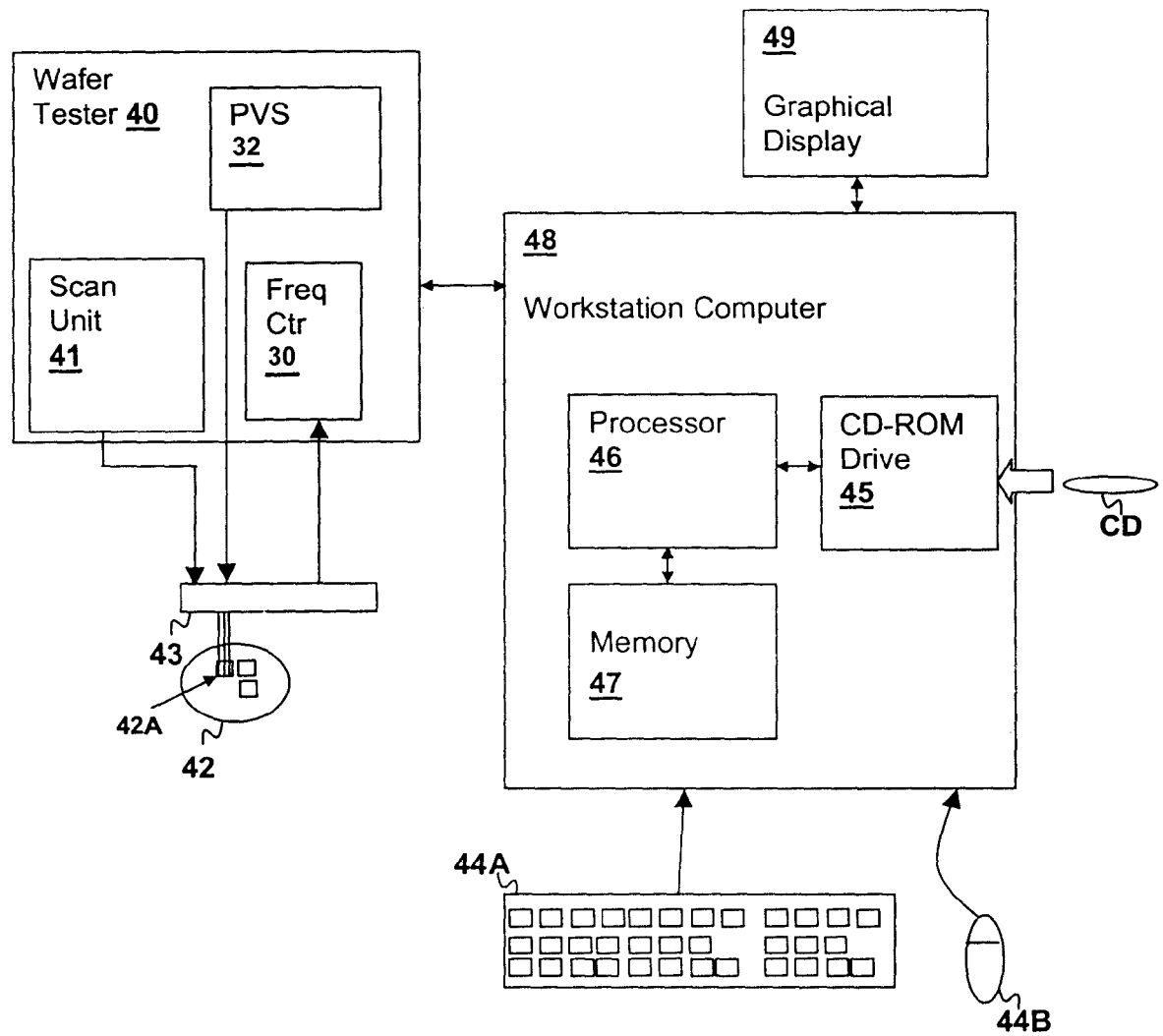
FIG. 5 is a block diagram of a wafer test system that may be used to perform circuit metric measurements using methods and circuits in accordance with embodiments of the invention.

Referring now to FIG. 5, a wafer test system in which a method according to an embodiment of the invention is performed, is shown. A wafer tester 40 includes a scan unit 41 for providing stimulus to a die circuit 42A on a wafer under test 42, via a probe head 43 having electrical test connections to die circuit 42A. Wafer tester 40 also includes a programmable voltage supply (PVS) 32, which may be used to vary the supply voltage provided to the test circuits of the present invention and is coupled to die circuit 42A via probe head 43. PVS 32 may be used to perform calibrations of voltage supply sensitivity as described above, and may also be varied for test purposes to evaluate the operation of the delay-based measurements. A frequency counter 30 may be optionally included to measure ring oscillator frequencies, eliminating the need for in-circuit counter circuits as described above.

A workstation computer 48, having a processor 46 coupled to a memory 47, for executing program instructions from memory 47, wherein the program instructions include program instructions for executing one or more methods in accordance with an embodiment of the present invention, is coupled to wafer tester 40, whereby the measurements described above are performed and measurements collected and stored in memory 47 and/or other media storage such as a hard disk. A CD-ROM drive 45 provides for import of program instructions in accordance with embodiments of the present invention that are stored on media such as compact disc CD. Workstation computer 48 is also coupled to a graphical display 49 for displaying program output such as the delay measurements and circuit metric values such as temperature and supply voltage computed from the delay measurements. Workstation computer 48 is further coupled to input devices such as a mouse 44B and a keyboard 44A for receiving user input. Workstation computer may be coupled to a public network such as the Internet, or may be a private network such as the various "intra-nets" and software containing program instructions embodying methods in accordance with embodiments of the present invention may be located on remote computers or locally within workstation computer 48. Further, workstation computer 48 may be coupled to wafer tester 40 by such a network connection.

While the system of FIG. 5 depicts a configuration suitable for sequential test of a plurality of dies on a wafer, the depicted system is illustrative and not a limitation of the present invention. Probe head 43 may be a multi-die full wafer probe system, or may comprise multiple probe heads for simultaneously testing multiple wafers on a single or multiple die basis. Additionally, while scan control and reading of delay values, raw D-latch or counter outputs, and/or computed circuit metrics is illustrated, the techniques of the present invention may also be applied to execution of measurement code from a processor incorporated on wafer 42 with appropriate interface to the outputs of the counters or delay circuit D-latches described above. The resultant generated display or data exported from workstation computer 48 may take the form of graphical depictions of the circuit metrics across the die, such as supply voltage and temperature topologies, or may other graphical or numerical information that describes the delays and/or circuit metrics and their variation across the circuit. Therefore, the correction of or simultaneous solution for circuit metric values may be performed completely within the die circuit 42A and read by scan unit 41 or a register interface or the correction/simultaneous solution may be performed by workstation computer 48.

Figure 6:
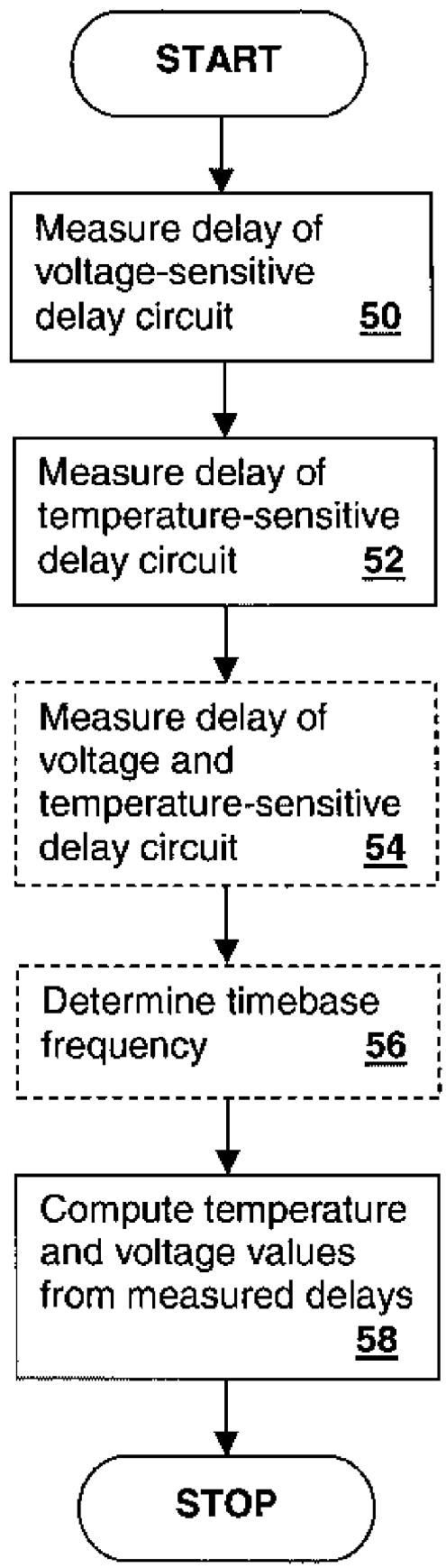
FIG. 6 is a flow chart of a method in accordance with an embodiment of the present invention.

Referring now to FIG. 6, a method in accordance with an embodiment of the invention is depicted in a flowchart. The illustrated method is that described with respect to the circuit of FIG. 1A, but it is understood that steps 50, 52 and 54 may be performed simultaneously, for example in the circuits of FIG. 1B or FIG. 3. The delay of a voltage-sensitive delay circuit is measured (step 50). The delay of a temperature-sensitive delay circuit is measured (step 52) and optionally the delay of a voltage and temperature sensitive circuit is measured (step 54). If the optional delay measurement of step 54 is made, the timebase (system clock) frequency can also be determined (step 56). The temperature and voltage values are then computed from the measured delays, yielding corrected results for the circuit metrics (step 58). The computation in steps 56 and 58 are understood to contemplate direct table look-up, logical combinatorial algorithms and computer software algorithms that may be performed on-chip to yield accessible metric values via registers, scan latches or other output mechanisms, or off-chip in a larger-scale processing system or test setup as shown in FIG. 5.

Figure 7:
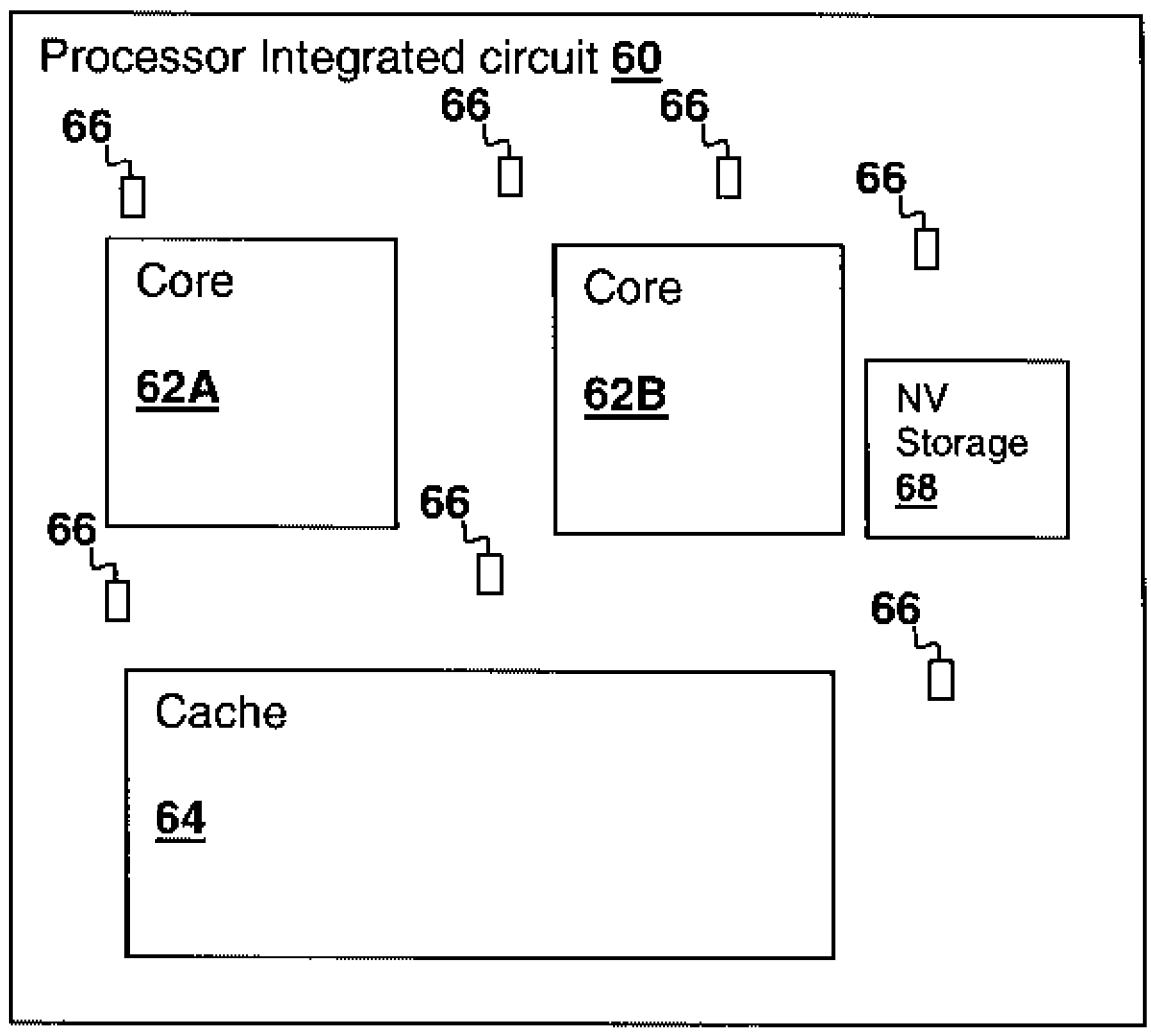
FIG. 7 is a pictorial diagram of a processor integrated circuit in accordance with an embodiment of the present invention.

Referring now to FIG. 7, a processor integrated circuit 60 in accordance with an embodiment of the present invention is shown. Processor integrated circuit is integrated on a single die and as illustrated, includes two processor cores 62A and 62B and a cache memory 64. Delay measurement circuits 66 are distributed around the die, so that local temperature, supply voltage, process and/or other metrics may be measured at particular points within the die. Delay measurement circuits 66 are coupled to one or both of processor cores 62 by a scan chain or other interface, so that the correction/simultaneous solution algorithms described above can be performed by one or both of processor cores 62A and 62B to obtain the circuit metric values. A non-volatile storage element 68 is provided to store coefficients determined from the calibration methods described below, so that delay measurement circuits 66 can compensate for process variations, either from die-to-die or from delay circuit-to-delay circuit. Delay measurement circuits 66 may be any of the circuits as illustrated in FIGS. 1A-1B, 2A-2B or FIG. 3.

Figure 8A:
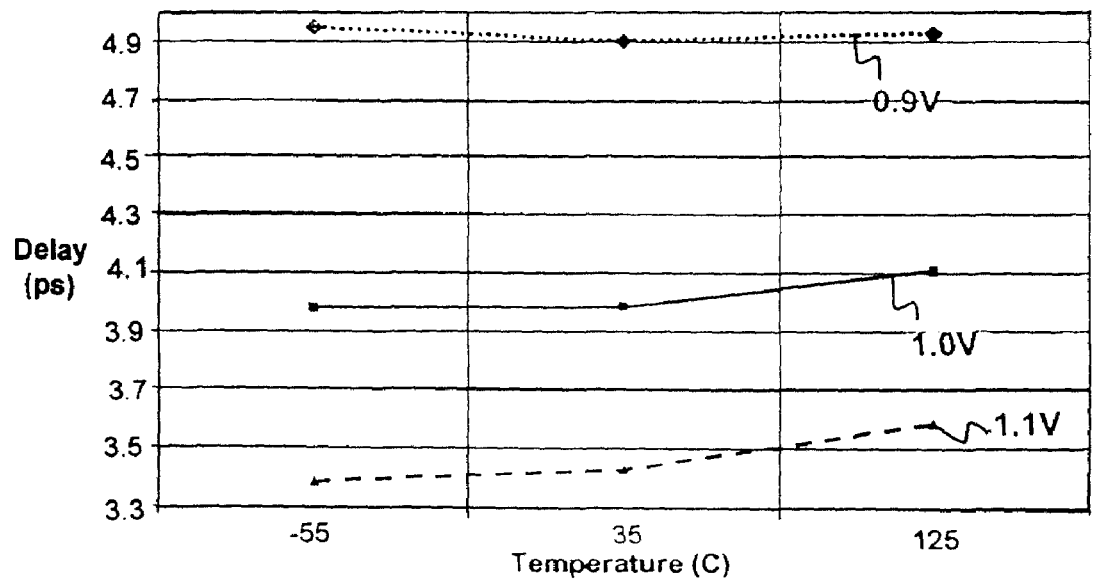
FIGS. 8A and 8B are graphs depicting delay versus temperature and voltage for a voltage-sensitized delay circuit and a temperature-sensitized delay circuit, respectively, for delay circuits in accordance with an embodiment of the present invention.
Figure 8B:
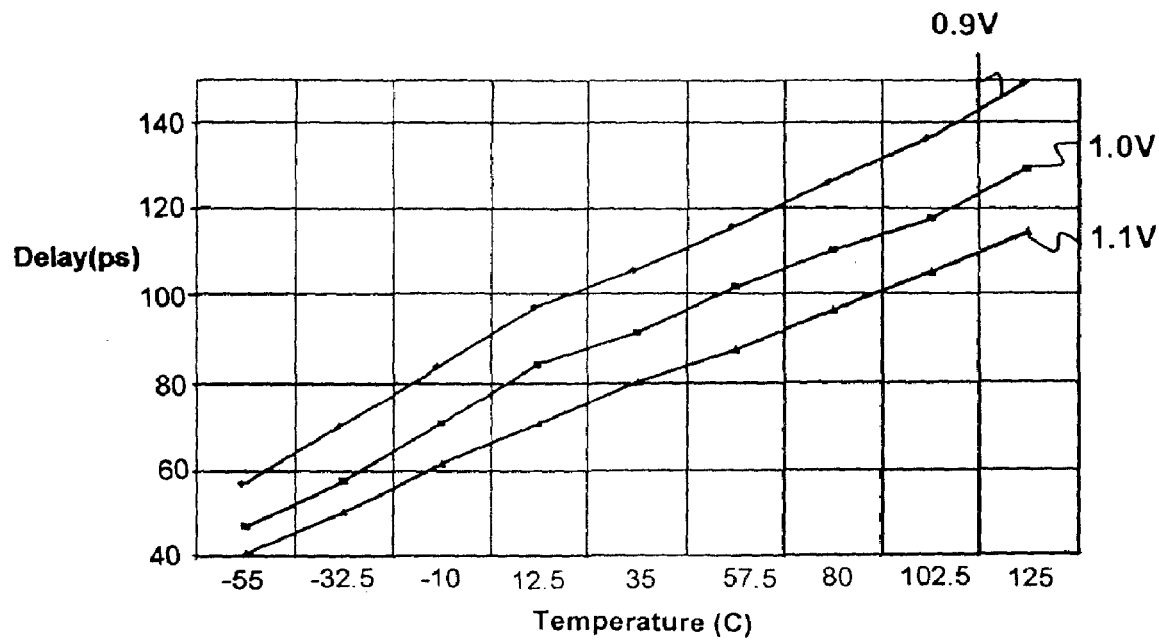

Referring now to FIG. 8A and FIG. 8B behavior of delay circuits in accordance with embodiments of the invention are shown. FIG. 8A is a graph depicting the variation of delay with temperature for a voltage-sensitized/temperature desensitized delay circuit, such as inverter 10A of FIG. 4A. As shown in the figure, the variation of delay over the full temperature range is small compared to the variation of delay with power supply voltage, which ranges from 0.9V to 1.1V in the depicted curves. Similarly, FIG. 8B is a graph depicting the variation of delay with temperature for a temperature-sensitized/voltage desensitized delay circuit, such as inverter 10B of FIG. 4B. As shown in the figure, the variation of delay with temperature is large compared to the variation of delay with power supply voltage. However, the depicted results are only nominal results corresponding to a particular nominal circuit.

Figure 9A:
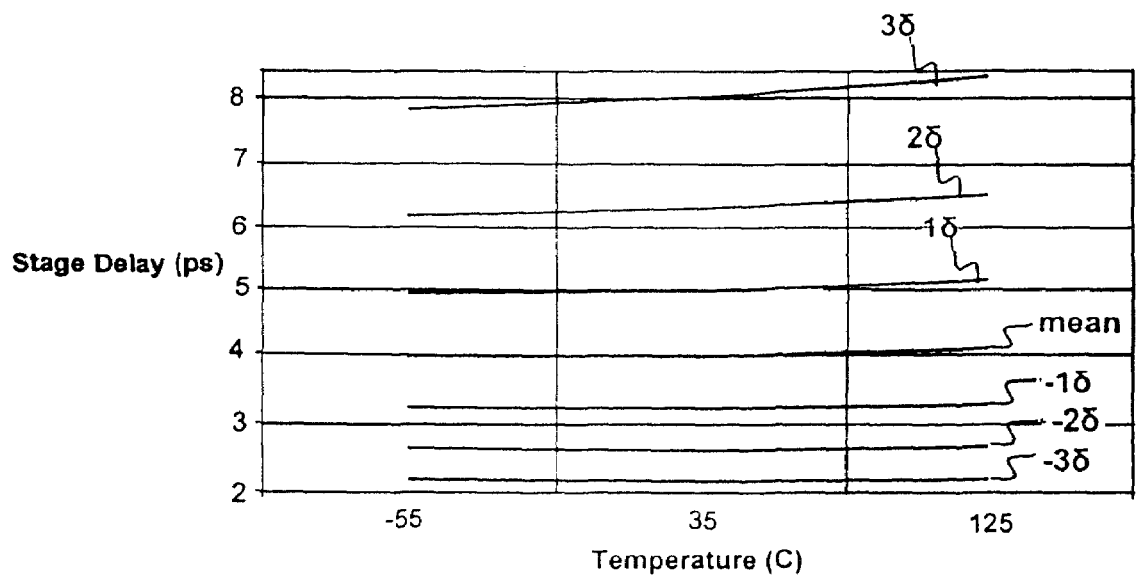
FIGS. 9A and 9B are graphs depicting delay versus temperature for various process corners of the voltage-sensitized delay circuit and temperature-sensitized delay circuit characterized by FIGS. 8A and 8B.
Figure 9B:
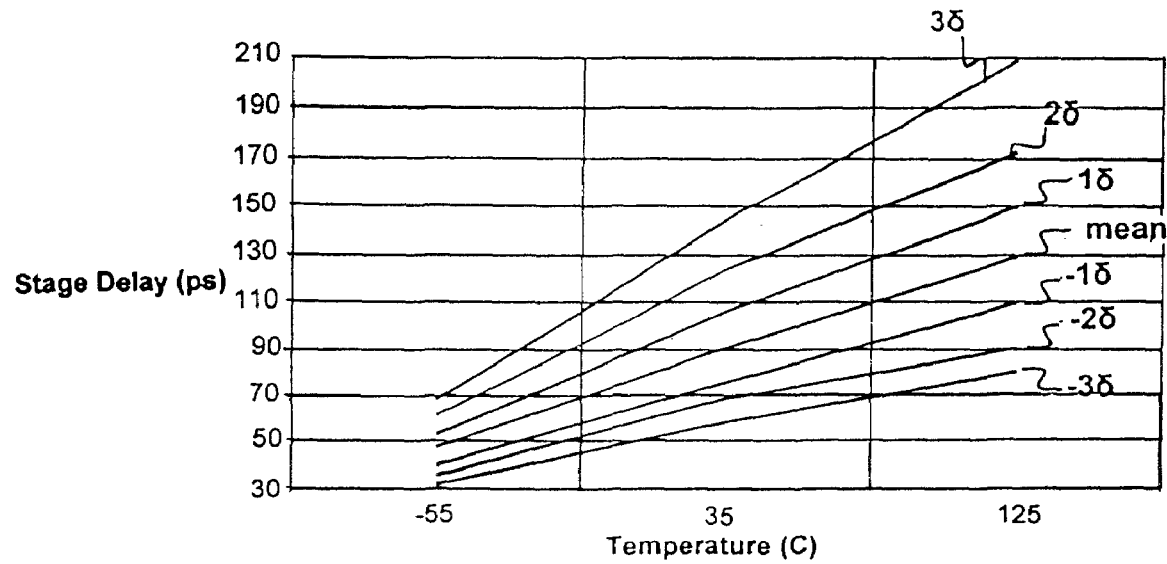

Referring now to FIG. 9A and FIG. 9B, the effects of process variation on the voltage sensitized and temperature-sensitized delay circuits, respectively, are depicted in graphical form. FIG. 9A, shows the variation of delay with process corner for a voltage-sensitized/temperature desensitized delay circuit, such as inverter 10A of FIG. 4A. As seen in the graph, in general across the temperature range, the variation in delay for a single standard deviation +1δ or −1δ from the nominal mean value, represents a delay change of 1 ps per stage. By comparison with the graph of FIG. 8A, such variation, representing approximately one-third of all circuits, corresponds to over 100 mV in voltage error, if the overall measurement circuit is not calibrated or otherwise compensated for variation in process. Similarly, the graph of FIG. 9B illustrates a variation generally on the order of 20 ps for a single standard deviation +1δ or −1δ from the nominal mean value of delay for a temperature-sensitized/voltage desensitized delay circuit, such as inverter 10B of FIG. 4B. By comparison with the graph of FIG. 8B, approximately one-third of all devices would exhibit a temperature error of greater than 45 degrees centigrade without taking process variation into account.

Figure 10A:
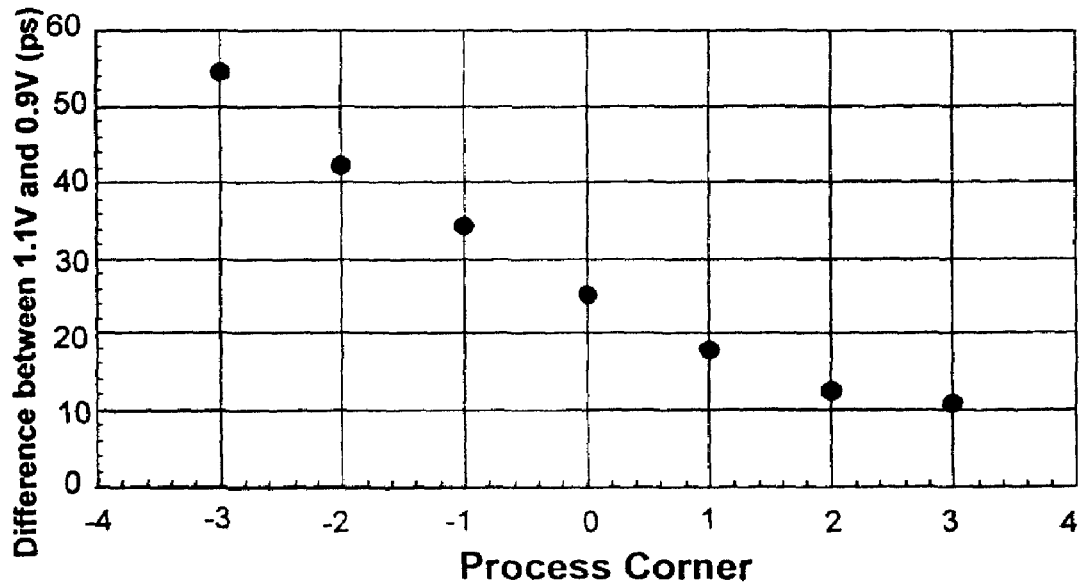
FIGS. 10A and 10B are graphs depicting delay range versus supply voltage range for the voltage-sensitized delay circuit and temperature-sensitized delay circuit characterized by FIGS. 8A and 8B, respectively.
Figure 10B:
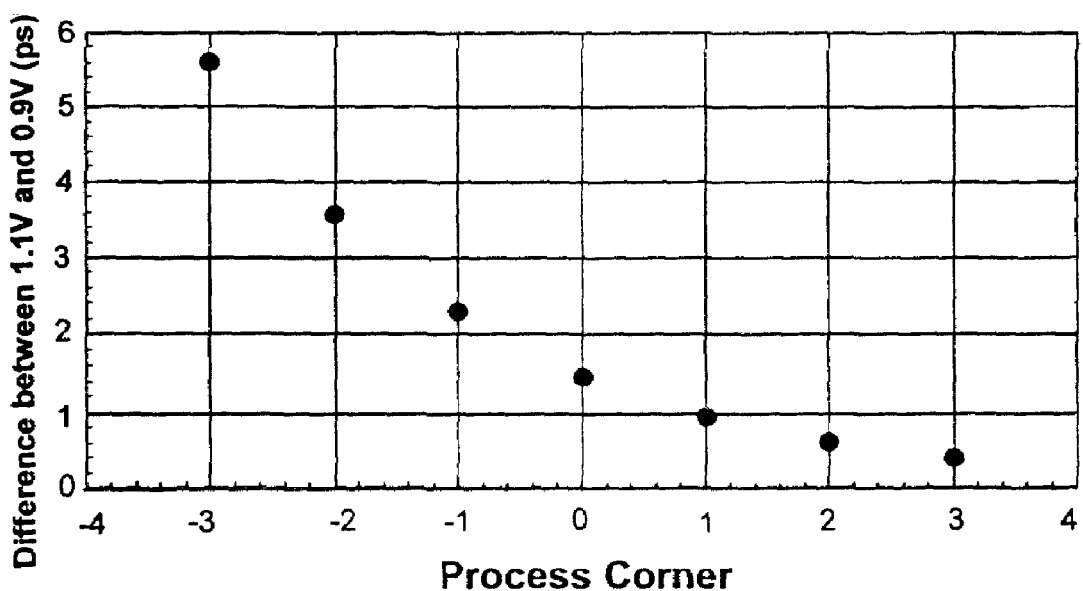

The process variation can be compensated-for in the delay measurement circuits of the present invention by obtaining delay measurement values at known temperatures and voltages or known voltage steps. Referring now to FIG. 10A, a graph of delay variation versus process corner is shown for a voltage difference of 200 mV (0.9V-1.1V) for a voltage-sensitized/temperature desensitized delay circuit, such as inverter 10A of FIG. 4A. The process corner is given in terms of standard deviation as used in FIGS. 9A-9B described above. FIG. 10B shows the variation of delay versus process corner for a temperature-sensitized/voltage desensitized delay circuit, such as inverter 10B of FIG. 4B. The graphs show values measured or simulated for the delay circuits at a predetermined temperature, so that variation in absolute delay, or delay change with voltage is determined by process variation alone. Thus, the process corner can be determined from equations or data representing either the absolute delay versus power supply voltage, or by measuring the delay for two differing power supply voltages and determining the process corner from the delay difference. Once the process corner for each delay circuit has been determined, the temperature and voltage delay coefficients for each sensor can be calculated. The wafer test system illustrated in FIG. 5 can be used to perform the calibration measurements in a temperature controlled environment and can also be used to program the calibration coefficients into non-volatile storage on a die, or provide calibration data to a program that performs the correction techniques of the present invention. While the exemplary embodiment shows determination of the process corner from a single data point, or from differences with respect to two data points, it is understood that any number of data points may be taken to improve the precision of the estimate of process corner.

Figure 11:
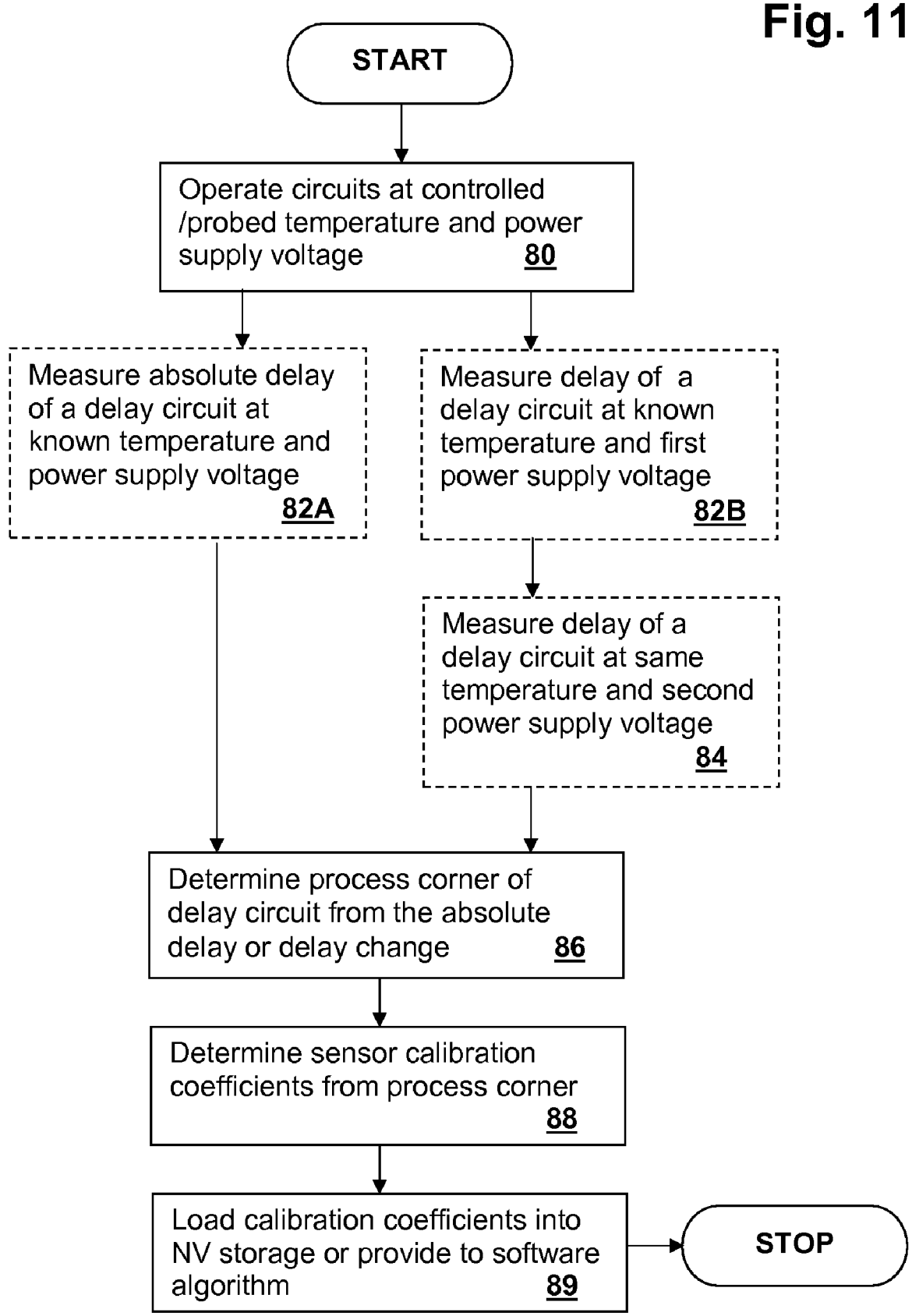
FIG. 11 is a flow chart of a calibration method in accordance with an embodiment of the present invention.

Referring now to FIG. 11, a method for calibrating a delay circuit, in accordance with an embodiment of the present invention, is shown. First the delay circuits are operated in a controlled or probed (known) temperature environment at a known power supply voltage (step 80). An absolute delay measurement is taken at the known temperature and voltage (step 82A) or the delay is measured at a first power supply voltage (step 82B) and at a second power supply voltage (step 84) to obtain a delay change. Next, the process corner of the delay circuit is determined (step 86) from either the absolute delay at a single voltage from Step 82A, or from the change in delay between step 82B and step 84. Once the process corner is known, the sensor calibration coefficients are determined from the process corner (step 88). Finally, the calibration coefficients are either loaded into the die in non-volatile storage or are supplied as calibration data to a software algorithm (step 89). While the process variation calibration of the present invention has been illustrated above as a correction applied by coefficients that relate multiple circuit delays to multiple circuit metrics such as power supply voltage and temperature, it is understood that the above-described calibration technique can be applied to circuits that measure only a single circuit metric using a single delay circuit, to provide process variation independence for that measurement, as well as the multiple delay circuit embodiments depicted herein.

While the invention has been particularly shown and described with reference to the preferred embodiments thereof, it will be understood by those skilled in the art that the foregoing and other changes in form, and details may be made therein without departing from the spirit and scope of the invention.

What is claimed is:

1. A method for determining at least one coefficient relating a delay of a delay circuit to a value of a circuit metric under measurement, the method comprising:

fixing an environment of the delay circuit so that the circuit metric has a fixed value;

measuring the delay of the delay circuit by a delay measurement circuit;

determining from a predetermined relationship expected between the delay of the delay circuit and a position within a process distribution for the circuit, at least one coefficient relating the delay of the delay circuit to the value of the circuit metric; and storing the at least one coefficient in an electronically-accessible storage location, whereby subsequent delay measurements of the delay circuit are corrected for the process variation using the at least one coefficient, wherein the fixing fixes a temperature of the delay circuit and a voltage of the delay circuit, and wherein the determining determines the position of the delay circuit within a predetermined distribution of delays corresponding to the process distribution, and determining the at least one coefficient in conformity with the position of the delay circuit within the predetermined distribution of delay differences.

2. The method of claim 1, wherein the storing stores the at least one coefficient in non-volatile storage located in a die that contains the delay circuit, and wherein the electronically accessible storage location is a location within the non-volatile storage.

3. The method of claim 1, wherein the storing stores the at least one coefficient in a memory of a processor that communicates with an integrated circuit that contains the delay circuit, and wherein the electronically accessible storage location is a location within the memory of the processor.

4. The method of claim 1, wherein the fixing fixes a temperature of the delay circuit, and wherein the method further comprises:

fixing a voltage of the delay circuit at a first voltage value, wherein the measuring measures the delay for the first voltage value;

fixing the voltage of the delay circuit at a second voltage value;

measuring a second delay corresponding to the second voltage value;

determining a delay difference between the delay and the second delay, and wherein the determining determines, from the delay difference, the position of the delay circuit within a predetermined distribution of delay differences for the particular difference between the first and second voltage; and determining the at least one coefficient in conformity with the position of the delay circuit within the predetermined distribution of delay differences.

5. The method of claim 1, wherein the delay circuit is a first delay circuit, and wherein the method further comprises second measuring a second time delay of a second delay circuit, wherein a first sensitivity of the time delay of the first delay circuit to the circuit metric under measurement differs from a second sensitivity of a second time delay of the second delay circuit to the circuit metric under measurement, and wherein the determining further determines a second position of the second delay circuit within a second predetermined process distribution for the second delay circuit, and determining at least one second one coefficient relating the time delay of the second circuit to the circuit metric under measurement.

6. The method of claim 5, wherein a third sensitivity of the first time delay of the first circuit to a second circuit metric under measurement differs from a fourth sensitivity of the second time delay of the second circuit to the second circuit metric under measurement, and wherein the method further comprises:
  fixing a value of the second metric prior to the measuring and second measuring; and
  determining a third coefficient relating the second time delay of the second circuit to the second circuit metric under measurement.

7. The method of claim 6, further comprising determining a fourth coefficient relating the first time delay of the first circuit to the second circuit metric under measurement.

8. A method for determining at least one coefficient relating a delay of a delay circuit to a value of a circuit metric under measurement, the method comprising:
  fixing an environment of the delay circuit so that the circuit metric has a fixed value;
  measuring the delay of the delay circuit by a delay measurement circuit;
  determining from a predetermined relationship expected between the delay of the delay circuit and a position within a process distribution for the circuit, at least one coefficient relating the delay of the delay circuit to the value of the circuit metric; and
  storing the at least one coefficient in an electronically-accessible storage location, whereby subsequent delay measurements of the delay circuit are corrected for the process variation using the at least one coefficient, wherein the delay circuit is a first delay circuit, and
  wherein the method further comprises second measuring a second time delay of a second delay circuit, wherein a first sensitivity of the time delay of the first delay circuit to the circuit metric under measurement differs from a second sensitivity of a second time delay of the second delay circuit to the circuit metric under measurement, and wherein the determining further determines a second position of the second delay circuit within a second predetermined process distribution for the second delay circuit, and determining at least one second one coefficient relating the time delay of the second circuit to the circuit metric under measurement.

9. The method of claim 8, wherein a third sensitivity of the first time delay of the first circuit to a second circuit metric under measurement differs from a fourth sensitivity of the second time delay of the second circuit to the second circuit metric under measurement, and wherein the method further comprises:
  fixing a value of the second metric prior to the measuring and second measuring; and
  determining a third coefficient relating the second time delay of the second circuit to the second circuit metric under measurement.

10. The method of claim 9, further comprising determining a fourth coefficient relating the first time delay of the first circuit to the second circuit metric under measurement.

\* \* \* \* \*